United States Patent [19]

Marumoto et al.

[11] Patent Number: 5,677,090
[45] Date of Patent: Oct. 14, 1997

[54] METHOD OF MAKING X-RAY MASK HAVING REDUCED STRESS

[75] Inventors: Kenji Marumoto; Hideki Yabe; Sunao Aya; Koji Kise; Kei Sasaki, all of Tokyo, Japan

[73] Assignee: Mitsubishi Denki Kabushiki Kaisha, Tokyo, Japan

[21] Appl. No.: 604,678

[22] Filed: Feb. 21, 1996

[30] Foreign Application Priority Data

Feb. 23, 1995  [JP]  Japan ................... 7-035131

[51] Int. Cl.⁶ ............................................. G03F 9/00
[52] U.S. Cl. .................. 430/5; 430/313; 378/34; 378/35
[58] Field of Search ................. 430/5, 312, 313; 428/428; 378/34, 35

[56] References Cited

U.S. PATENT DOCUMENTS

| | | | |
|---|---|---|---|
| 4,873,162 | 10/1989 | Yoshioka et al. | 430/5 |
| 5,124,561 | 6/1992 | Faure et al. | 430/5 |
| 5,132,186 | 7/1992 | Takeuchi et al. | 430/5 |
| 5,188,706 | 2/1993 | Hori et al. | 430/5 |
| 5,500,312 | 3/1996 | Harriott et al. | 430/5 |
| 5,541,023 | 7/1996 | Kondo et al. | 430/5 |

FOREIGN PATENT DOCUMENTS 5217862  8/1993  Japan.

OTHER PUBLICATIONS

SPIE-The International Society for Optical Engineering, "Electron-Beam, X-Ray, and Ion-Beam Submicrometer Lithographies for Manufacturing IV", vol. 2194, pp. 221-130 Jan. 1994.

*Primary Examiner*—S. Rosasco
*Attorney, Agent, or Firm*—Leydig, Voit & Mayer, Ltd.

[57] ABSTRACT

A method of making a X-ray mask including: a step of forming a X-ray absorber above a substrate; a step of controlling a stress of the X-ray absorber by a predetermined condition; and wherein the predetermined condition for controlling the stress of the X-ray absorber formed above the substrate is determined by a measured value of a stress of a X-ray absorber formed on a monitor substrate.

7 Claims, 11 Drawing Sheets

METHOD OF MAKING X-RAY MASK HAVING REDUCED STRESS

BACKGROUND OF THE INVENTION

1. Field of the Invention

The present invention relates to a X-ray mask used in X-ray lithography and a method of making the mask.

2. Discussion of Background

Figure 9:
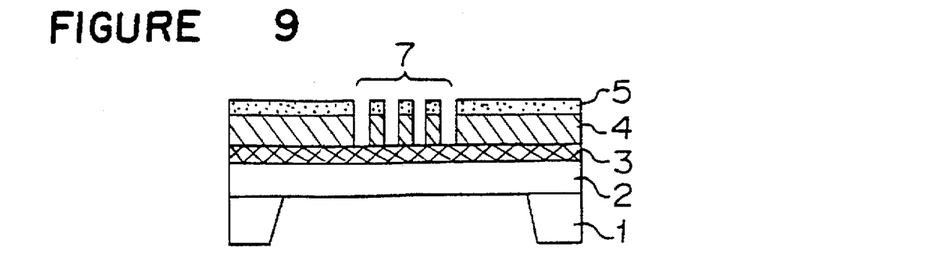
FIG. 9 is a sectional view showing the structure of a conventional X-ray mask.
Figure 10:
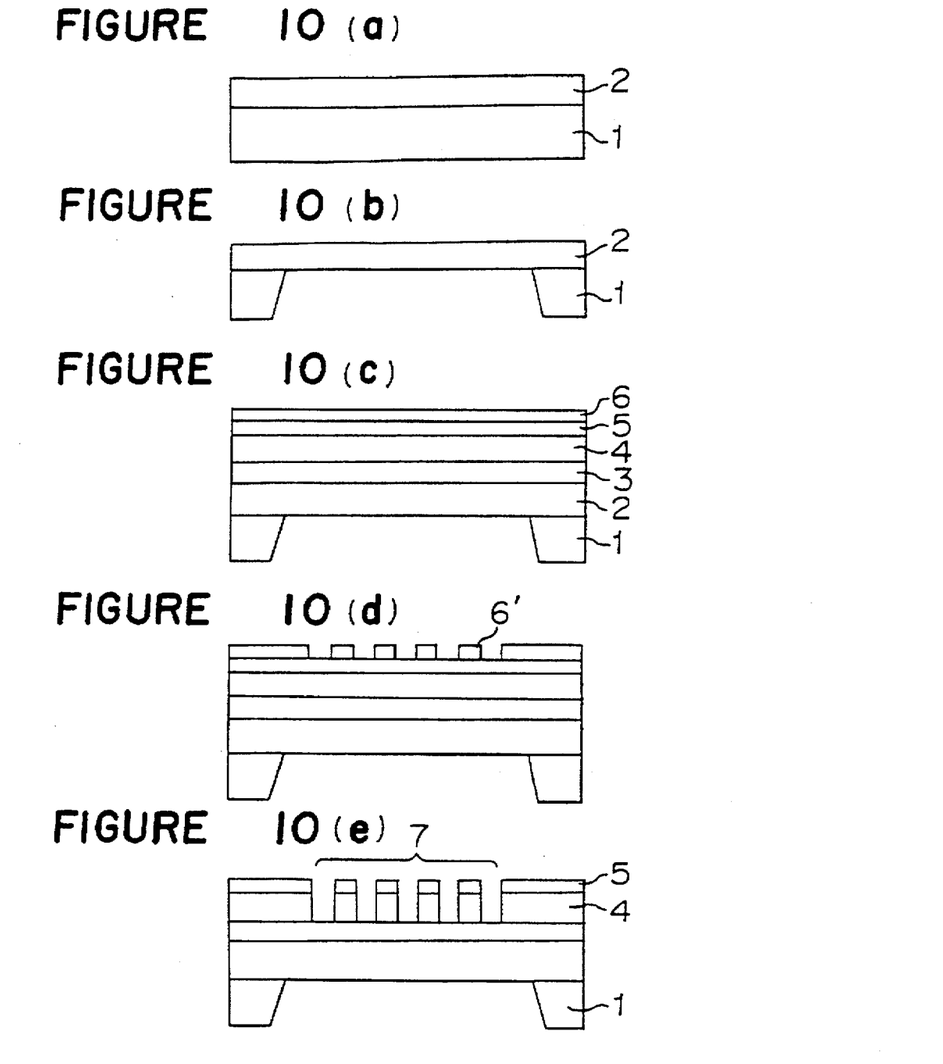
FIGS. 10(a), 10(b), 10(c), 10(d) and 10(e) are diagrams showing a method of manufacturing a conventional X-ray mask.

FIG. 9 shows the outline structure of a conventional X-ray mask disclosed in Japanese Unexamined Patent Publication No. Hei. No. 5-217862. In FIG. 9 numeral 1 designates a silicon substrate having a thickness of approximately 2 mm, numeral 2 designates a membrane (X-ray transmitting material) having a thickness of approximately 2 μm which is formed on the silicon substrate and which is normally made of light element ceramics having improved transmittance such as SiC etc. Numeral 3 designates a protective film for preventing the membrane from reflecting of visible light or stating charging by charged particles, which is made of indium tin oxide (ITO). Numeral 4 designates an X-ray absorber consisting of a film of tungsten including 1 through 2% of titanium (W—Ti), on which a desired circuit pattern 7 of a semiconductor is formed. Numeral 5 designates a chromium etching mask for patterning the X-ray absorber.

Next, an explanation will be given of the manufacturing process of the above-mentioned X-ray mask in accordance with FIGS. 10(a), 10(b), 10(c), 10(d) and 10(e). In step (a) the SiC film 2 is formed on the upper face of the substrate 1 and in step (b) the central portion of the silicon substrate is dissolved and removed by a chemical solution such as hydrofluoric acid/nitric acid by which a self-supporting film (membrane) 2 of SiC is formed. This step is called back-etching. Next, in step (c) the ITO film 3 as an etching stopper and reflection preventer, the W—Ti film 4 that is an absorber of X-rays, the chromium film 5 as the etching mask and the resist film 6 are successively formed by sputtering or spin coating process and a semiconductor pattern is drawn by an electron beam (not shown). In step (d) the resist is developed and a resist pattern 6' is formed. In step (e) the chromium film is etched using a mixture of $Cl_2/O_2$ and the circuit pattern 7 of W—Ti is formed by a low temperature etching in which a mixture of $SF_6/CHF_3$ is used with the chromium film as the etching mask. The silicon substrate is cooled from the bottom down to approximately −50° C. by low temperature helium etc. The ITO film at the bottom face has large etch selectivity with respect to W—Ti and accordingly, it is stable even with a prolonged etching time and a uniform vertical pattern can be formed in the mask face.

Figure 11:
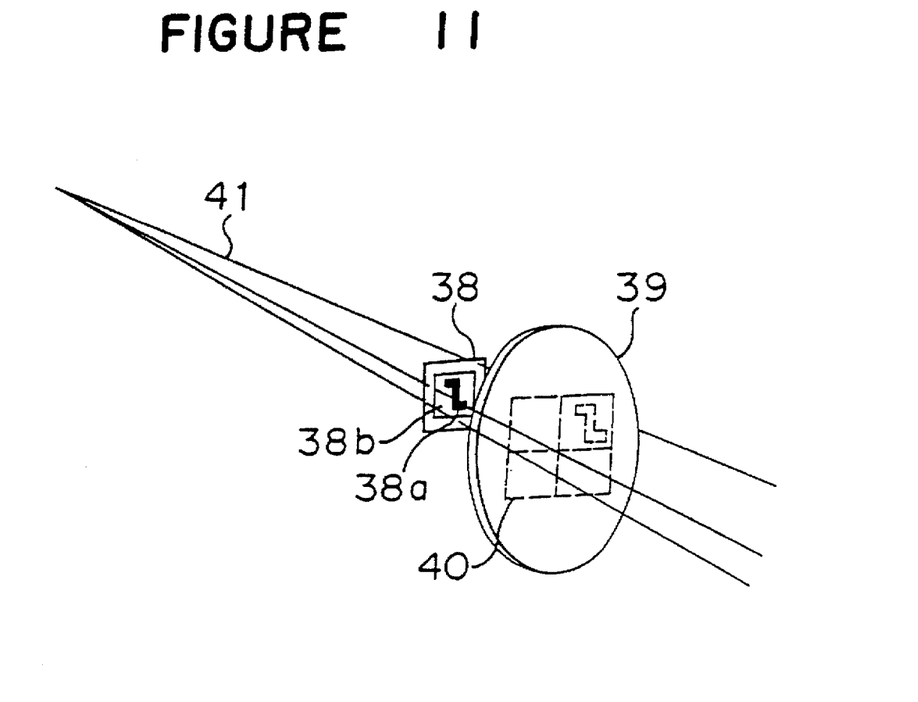
FIG. 11 is a diagram illustrating the principle of transcribing a pattern using a X-ray mask.

FIG. 11 shows the principle of transcribing a pattern on a silicon wafer by using a finished X-ray mask. In this example an X-ray mask 38 is installed proximate and paralled to a silicon wafer 39 coated with an exposure material (resist) (gap=10–50 μm) X-rays 41 from a synchrotron radiation (SR) beam or the like irradiates it. A fine semiconductor pattern 38a on the mask can be transcribed on the silicon wafer 39. In FIG. 11 notation 38b designates a region (window) having the fine semiconductor pattern 38a on the mask and numeral 40 designates a pattern transcribed on the silicon wafer 39.

It is indispensable for promoting positional accuracy of a pattern on an X-ray mask to achieve a low stress state of a X-ray absorber (smaller than 10 MPa). However, reproducibility of a film forming step is insufficient and accordingly, when film formation of an absorber is performed in accordance with a predetermined process, stresses vary in a range of, for example, ±50 MPa. It is conceivable to measure the stress of the absorber in an X-ray masking step. However, only an absorber suitable for stress measurement can be used and it cannot be used as an X-ray mask. Meanwhile, normally, in the stress measurement bowing of a silicon wafer used as a substrate of a membrane for an X-ray mask is measured and accordingly, its configuration is different from that of an actually used X-ray mask and accurate stress measurement and control have been difficult.

Further, the stress measurement poses the following problem. FIGS. 12(a), 12(b), 12(c) and 12(d) show a manufacturing process of a simplest X-ray mask and FIG. 13 shows the structure of an X-ray mask in which a desired film is laminated on an X-ray absorber. In these figures numeral 1 designates a silicon substrate, numeral 2 designates a membrane made of SiC, numeral 4 designates an X-ray absorber, numeral 6 designates a resist, numeral 8 designates a support ring, numeral 9 designates an etching stopper made of chromium, numeral 10 designates an anti-reflective coating (AR coating) made of $SiO_2$ and numeral 50 designates a planarizing film made of $SiO_2$. The planarizing film 50 is a film necessary for making amorphous the W—Ti film 4 that is the X-ray absorber formed on this film. In FIG. 13 these films are formed in an order indicated by the drawing and an electron beam resist (not shown) is applied to these laminated films. A pattern is formed by etching the X-ray absorber 4 of W—Ti and at the same time the planarizing film 50 with the resist pattern formed by electron beam lithography as a mask. Further, the layers are etched up to the etching stopper 9 and patterned, the resist is removed and an X-ray mask with the pattern is finished.

Figure 12A:
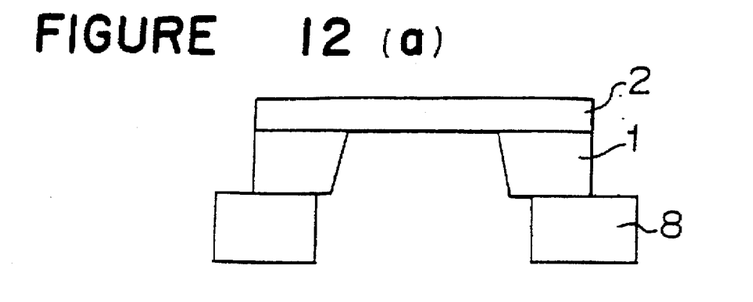
FIGS. 12(a), 12(b), 12(c) and 12(d) are diagrams showing steps of manufacturing an a conventional X-ray mask.
Figure 12B:
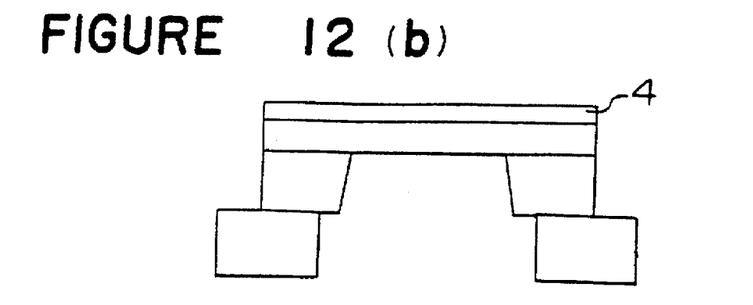
Figure 12C:
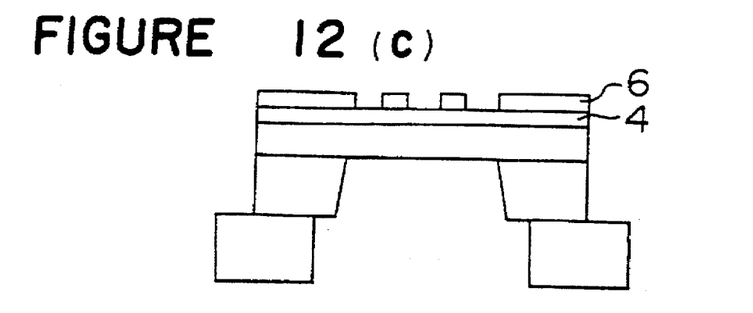
Figure 12D:
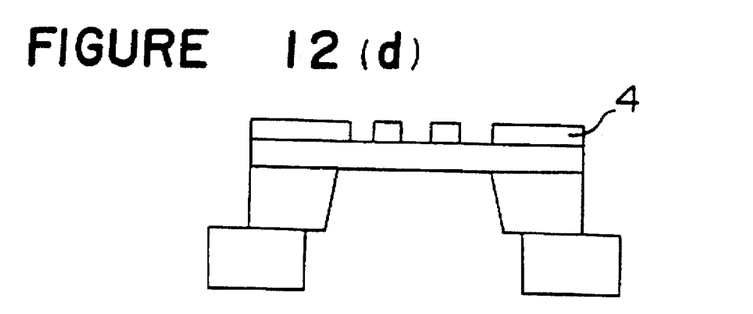
Figure 13:
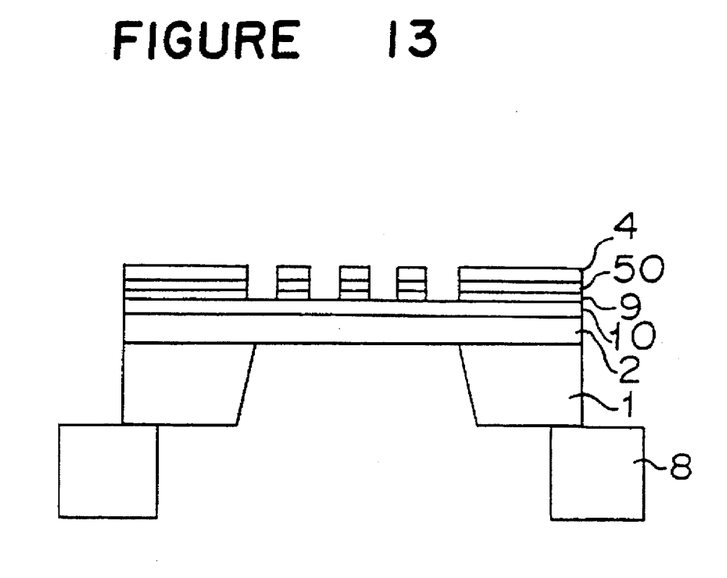
FIG. 13 is another sectional view showing the structure of a conventional X-ray mask.

With the simple structure as shown in FIG. 12(d) stress control is performed only on the X-ray absorber and the positional accuracy of the pattern can be ensured if low stress stress state can be realized. However, with the laminated structure as shown in FIG. 13, although stress control is performed only with respect to the X-ray absorber, the stress control is not performed with respect to the films each finally having a pattern the same as that of the X-ray absorber, the etching stopper 9 made of chromium and the planarizing film 50 made of $SiO_2$, in this case and the positional accuracy of the pattern is reduced by residual stress.

SUMMARY OF THE INVENTION

The object of the present invention is to resolve such an issue and to provide an X-ray mask and a method of making a X-ray mask capable of making accurately a pattern of an absorber of an X-ray mask.

According to a first aspect of the present invention, there is provided a method of making a X-ray mask comprising:
 a step of forming a X-ray absorber above a substrate;
 a step of controlling a stress of the X-ray absorber by a predetermined condition; and
 wherein the predetermined condition for controlling the stress of the X-ray absorber formed above the substrate is determined by a measured value of a stress of a X-ray absorber formed on a monitor substrate.

According to a second aspect of the present invention, there is provided a method of making a X-ray mask comprising:
 a step of forming a X-ray absorber above a substrate;
 a step of forming a predetermined layer above the X-ray absorber;
 a step of forming a predetermined pattern on at least the X-ray absorber;

a step of forming at least one layer having a pattern the same as the pattern of the X-ray absorber at a time point of finishing the X-ray mask; and a step of measuring a total of a first stress of the X-ray absorber and a second stress of the at least one layer having the pattern the same as the pattern of the X-ray absorber and controlling the first and the second stresses.

According to a third aspect of the present invention, there is provided the method of making a X-ray mask according to the second aspect, wherein the step of measuring the total of the first stress of the X-ray absorber and the second stress of the at least one layer having the pattern the same as the pattern of the X-ray absorber and controlling the first and the second stresses comprises a repetition of a stress measurement and annealing, an annealing temperature of the annealing is lower than a desired annealing temperature, the annealing is performed once or plural times, the total of the first and the second stresses after the annealing is measured, a final annealing temperature is determined by a result of measuring the total of the first and the second stresses immediately after the step of forming the at least one layer having the pattern the same as the pattern of the X-ray absorber and a result of measuring the total of the first and the second stresses after the annealing once or plural times and a final annealing is performed at the final annealing temperature.

According to a fourth aspect of the present invention, there is provided the method of making a X-ray mask according to the second aspect or the third aspect, wherein a monitor substrate other than the substrate is used in the step of measuring the total of the first stress of the X-ray absorber and the second stress of the at least one layer having the pattern the same as the pattern of the X-ray absorber, successive to the step of forming the at least one layer having the pattern the same as the pattern of the X-ray absorber at the time point of finishing the X-ray mask and a condition of controlling the total of the first stress of the X-ray absorber and the second stress of the substrate on which the at least one layer having the pattern the same as the pattern of the X-ray absorber at the time point of finishing the X-ray mask is determined based on a result of measuring layers stress using the monitor substrate above which a X-ray absorber and at least one layer having a pattern the same as a pattern of the X-ray absorber is formed at the time point of finishing the X-ray mask.

According to the fifth aspect of the present invention, there is provided the method of making a X-ray mask according to the first or the fourth aspect, the monitor substrate is a substrate in which a back-etching has been performed.

According to the first aspect of the method of making a X-ray mask of the present invention, the stress of the X-ray absorber film is evaluated by using the monitor substrate which is installed simultaneously in the film formation of the X-ray absorber and accordingly, an accurate stress of the X-ray absorber of the X-ray mask in processing can be known and a low stress state of the X-ray absorber can be achieved by the information.

According to the second aspect of the method of making a X-ray mask of the present invention, stresses of films each having a pattern the same as that of the X-ray absorber are also considered and these stresses are summarizingly controlled and accordingly, the positional accuracy of the pattern is promoted.

According to the third aspect of the method of making a X-ray mask of the present invention, stresses of films each having a pattern the same as that of the X-ray absorber are also considered and these are summarizingly controlled and accordingly, the positional accuracy of the pattern is promoted. Further, the final annealing temperature is determined by the relationship between the stress and the annealing temperature by the annealing at the temperatures lower than the desired temperature and therefore, an optimum annealing temperature can be set.

According to the fourth aspect of the method of making a X-ray mask of the present invention, in the second or third aspect, the monitor substrate is separately arranged for the stress measurement and control and therefore, accurate stresses of the X-ray absorber and the layers each having the pattern same as that of the X-ray absorber of the X-ray mask in processing can summarizingly be known and a low stress state thereof can be achieved by summarizingly controlling the stresses by the information.

According to the fifth aspect of the method of making a X-ray mask of the present invention, in the first or the fourth aspect, the substrate in which the back-etching has been performed is used as the monitor substrate and therefore, a substrate more approximated to that in an actual process is used and accurate stresses more approximated to those in the process can be measured by which a low stress state thereof can be achieved.

DETAILED DESCRIPTION OF THE PREFERRED EMBODIMENTS

EMBODIMENT 1

Figure 1:
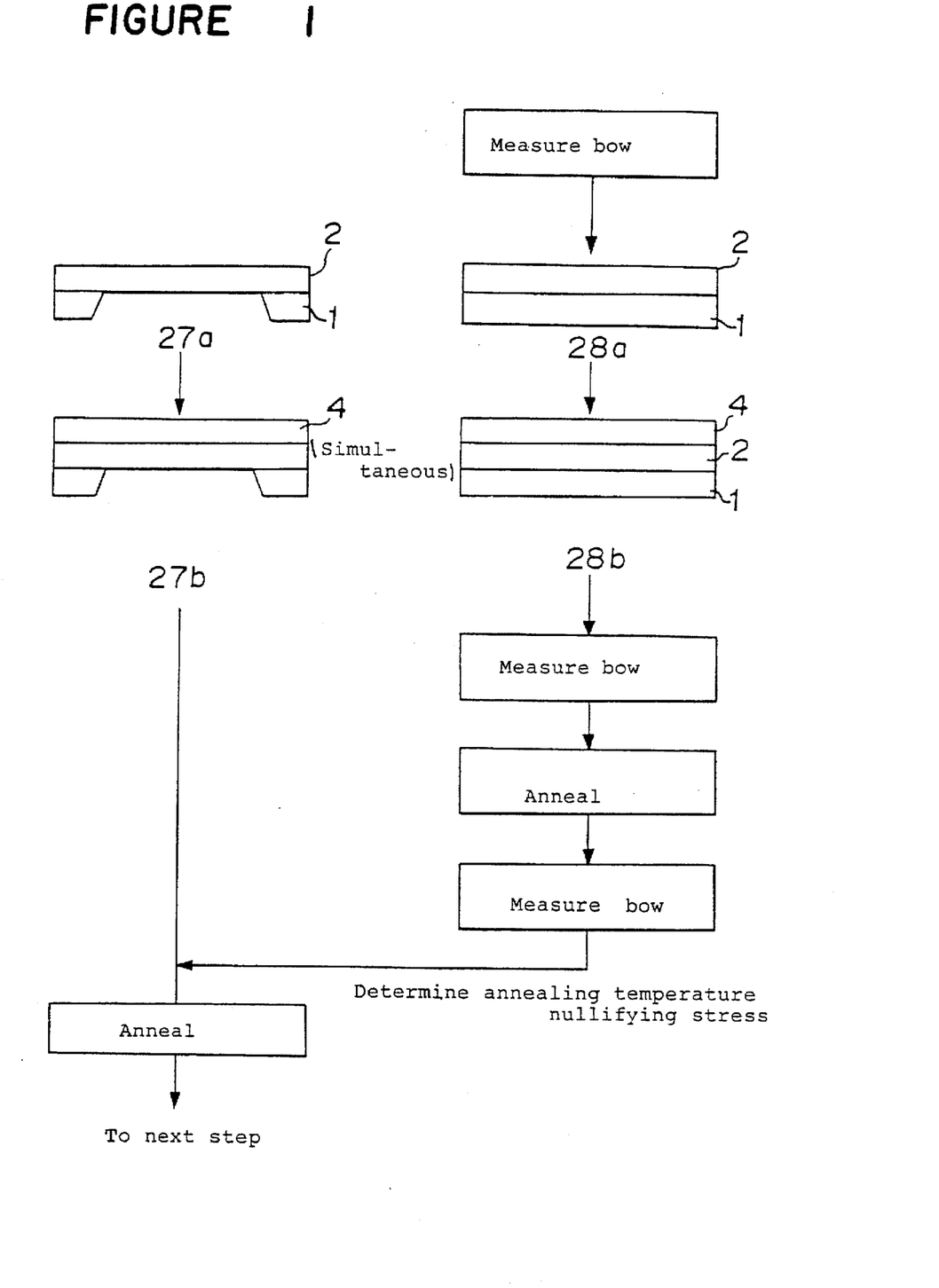
FIG. 1 is a diagram showing steps of manufacturing an X-ray mask according to a first embodiment of the present invention.

An explanation will be given of an embodiment of the present invention in reference to the drawings as follows. FIG. 1 is a diagram showing manufacturing steps of a X-ray mask according to the embodiment of the present invention. In FIG. 1 notation 27a designates a X-ray mask in which a silicon film has been back-etched. Notation 28a designates a silicon wafer for which a bow measurement has previously been performed and which is a wafer for X-ray mask monitor for stress measurement, on one face of which a membrane is formed. W—Ti absorbers are formed on these in the same device and in the same batch. Notation 27b designates the X-ray mask after film formation and notation 28b designates the silicon wafer after film formation. At this occasion a sputtering device having a stage of a rotation and revolution type is used such that X-ray absorber films 4 having the same properties are formed and the distances between the target and the substrates are rendered constant. After the film formation, bow of the wafer 28b for the X-ray mask monitor for stress measurement is measured and annealing is performed. After annealing the bow of the monitor wafer is measured again and a final annealing temperature nullifying the stress of the X-ray absorber 4 is determined from these measurement results. In the W—Ti absorber film the annealing temperature and the change in stress are in proportion to each other and accordingly, the determination of the final anneal temperature is facilitated. Further, the annealing of the X-ray mask in processing is performed at the above-mentioned final annealing temperature. Thereby, an X-ray mask on which the absorber having low stress is formed can be provided independent reproducibility among batches of a sputtering device.

Figure 2:
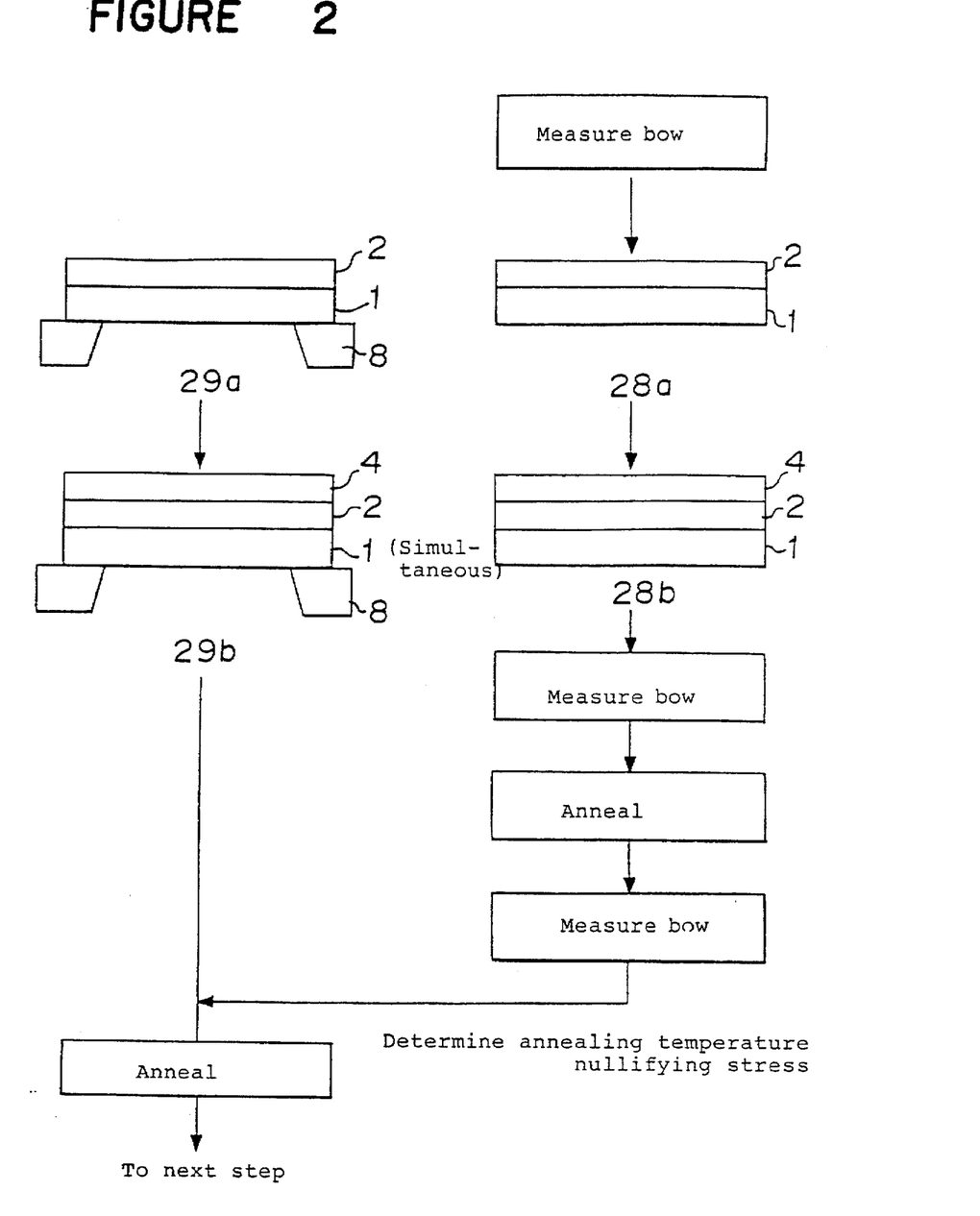
FIG. 2 is a diagram showing steps of manufacturing an X-ray mask according to the first embodiment of the present invention.

Although explanation has been given of example in which a support ring is not bonded to the silicon substrate as in FIG. 2 showing steps of manufacturing an X-ray mask, it is possible to determine the annealing temperature providing the absorber with low stress by a similar process. An X-ray mask monitor wafer for stress measurement is arranged in the same sputtering device, even in a state where the silicon substrate 1 on which the membrane 2 has been formed by the X-ray mask during processing, is bonded to a support ring 8. Incidentally, in FIG. 2 notation 29a designates an X-ray mask which is bonded with the support ring and notation 29b designates a state where the X-ray absorber is formed on the X-ray mask.

Figure 3:
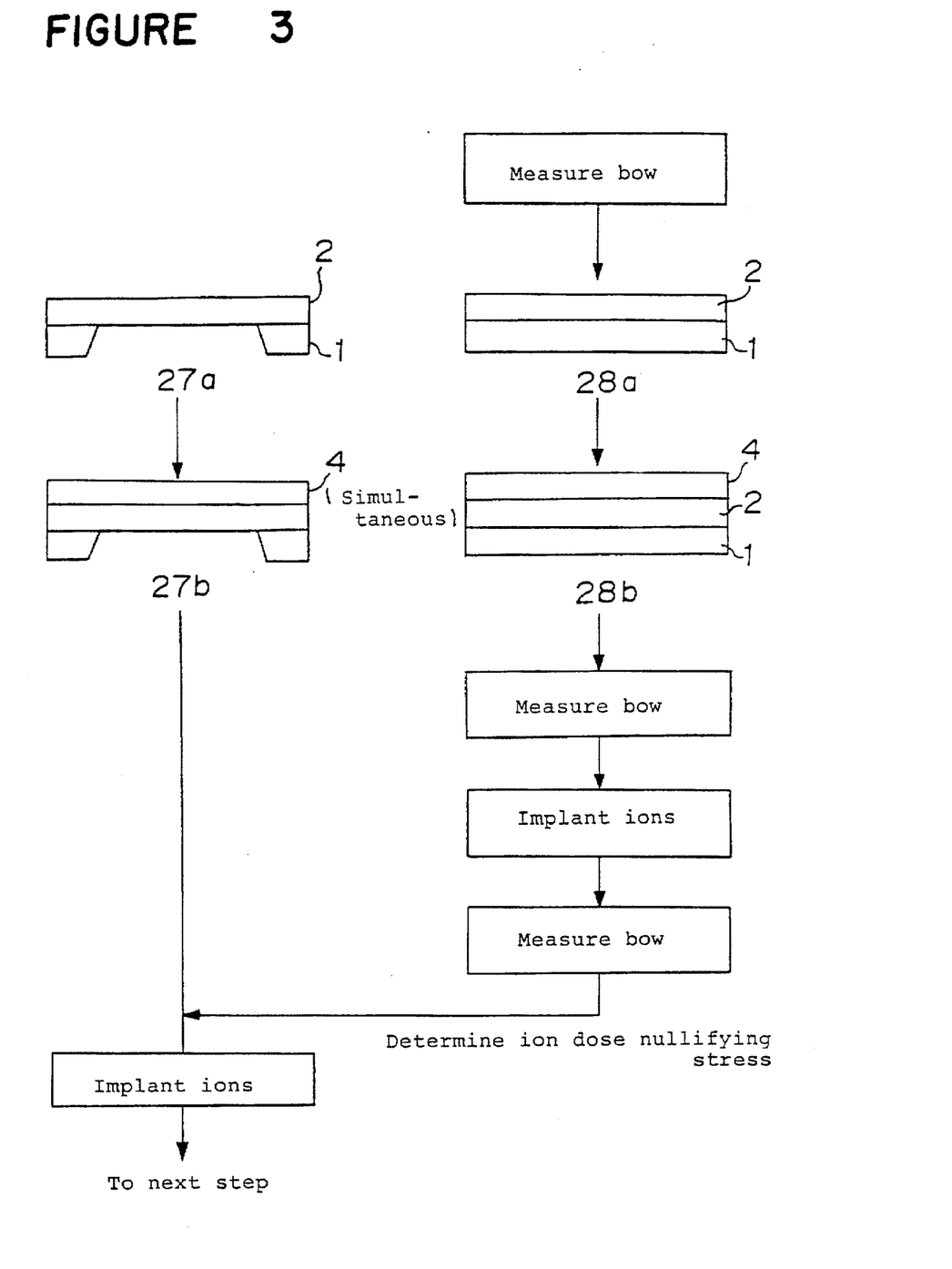
FIG. 3 is a diagram showing steps of manufacturing the X-ray mask according to the first embodiment of the present invention.

Further, although an explanation has been given of the example using the annealing step as a method of providing an absorber with low stress, as in FIG. 3 showing manufacturing steps of a X-ray mask, stress control of an absorber film may be performed by ion implantation. In this case a final ion dose amount is determined by measuring bow of a monitor wafer and an absorber having nullified stress is provided by applying a dose amount of that value to an X-ray mask in processing.

Further, although explanation has been given of examples where a silicon substrate that is a material the same as that of the substrate used as the monitor wafer in the above-mentioned embodiments, it is not restricted to a silicon substrate so far as it is a material clarifying a relationship between film forming conditions and stress and a correlation of stress to that of a silicon substrate. Using a silicon substrate has an effect in which monitoring can be carried out inexpensively.

EMBODIMENT 2

Figure 4:
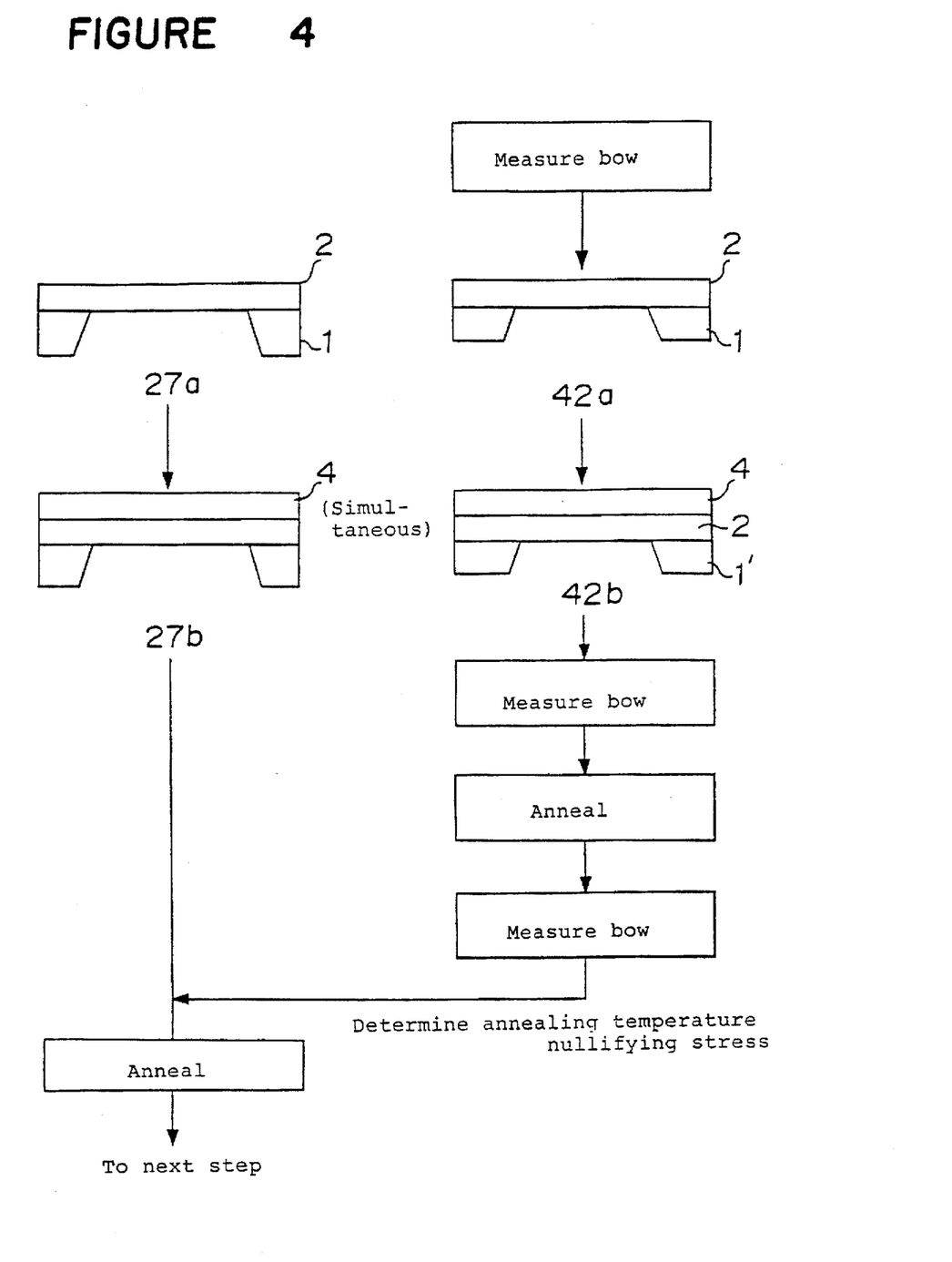
FIG. 4 is a diagram method of manufacturing an X-ray mask according to a second embodiment of the present invention.

An explanation will be given of an embodiment of the present invention in reference to the drawings as follows. Although the explanation has been given of the example of using a silicon wafer as the X-ray mask monitor wafer for stress measurement in the above-mentioned first embodiment, it is preferable to use a wafer in which back-etching has been performed, similar to an X-ray mask manufacturing steps, for more accurate stress monitoring, although it is more expensive than a silicon wafer. FIG. 4 is a diagram showing manufacturing steps of an X-ray mask according to an embodiment of the present invention. In FIG. 4 notation 42a is a monitor wafer before film formation in which back-etching has been performed and notation 42b designates a monitor wafer after film formation in which back-etching has been performed. The back-etched wafer is normally warped in a dish-like form by tensile stress. When a change in the stress is measured with the warped state as a reference, a stress approximately equal to the stress in an actual process can accurately be measured and accordingly, a state of low stress can be achieved. Further, the X-ray mask substrate 1 for manufacturing consists of a silicon wafer having a thickness of approximately 2 mm and a monitor wafer 1' uses a silicon wafer having a thickness of approximately 0.4 mm. The thinner the wafer, the more accurately the stress can be measured. Accordingly, the change in stress due to film formation of the absorber or annealing can be measured with improved sensitivity by the monitor wafer and more accurate stress control can be achieved.

Further, determination of an annealing temperature nullifying stress is described in FIG. 4 as a stress control process which is similar to that of the first embodiment. Moreover, stress control of the absorber film may be performed by ion implantation as in FIG. 3 of the first embodiment. In this case a final ion dose amount is determined by measuring bow of a back-etched monitor wafer and a dose amount of that value is applied on the X-ray mask in processing by which an absorber nullifying stress is provided.

EMBODIMENT 3

Figure 5A:
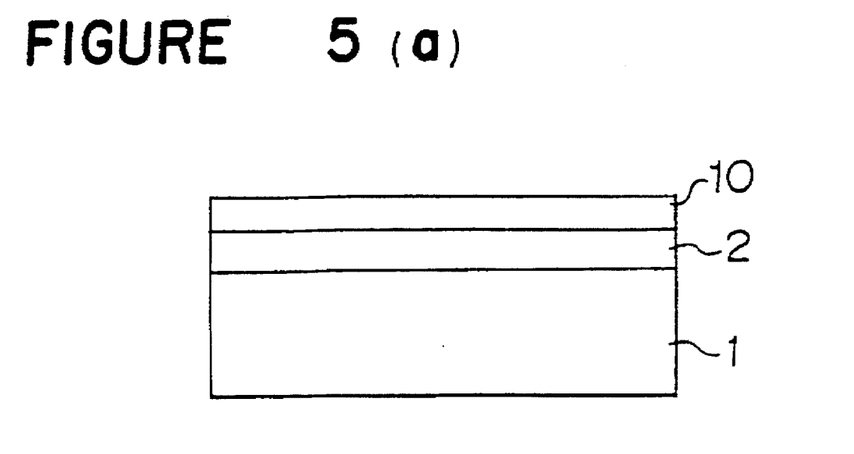
FIGS. 5(a) and 5(b) are step diagrams showing the method of manufacturing an X-ray mask according to a third embodiment of the present invention.
Figure 5B:
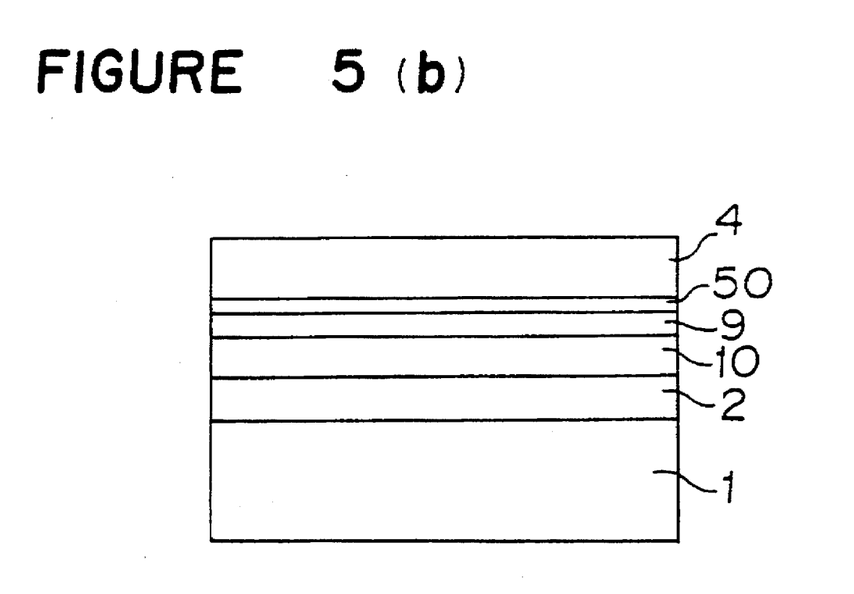

An explanation will be given of an embodiment of the present invention in reference to the drawings as follows. In the above-mentioned first embodiment, the low stress state is achieved by paying attention to a monitor corresponding to an X-ray mask having the simplest structure or only to the X-ray absorber. However, with respect to steps of manufacturing an X-ray mask having films on each of which a pattern the same as that of the X-ray absorber is finally formed, it is necessary to perform the stress control with regard to these films. FIGS. 5(a) and 5(b) show portions of steps of manufacturing an X-ray mask having films on each of which a pattern the same as that of the X-ray absorber is formed. FIG. 5(a) shows a state of a substrate before forming the X-ray absorber. In this diagram only the membrane 2 and the anti-reflective coating (AR coating) 10 have been formed on the silicon wafer 1. FIG. 5(b) shows a state of the X-ray mask on which desired films have been formed on the substrate before annealing. At this stage the chromium etching stopper 9, the planarizing film 50 made of silicon oxide and the W—Ti absorber film 4 have been formed.

Figure 6:
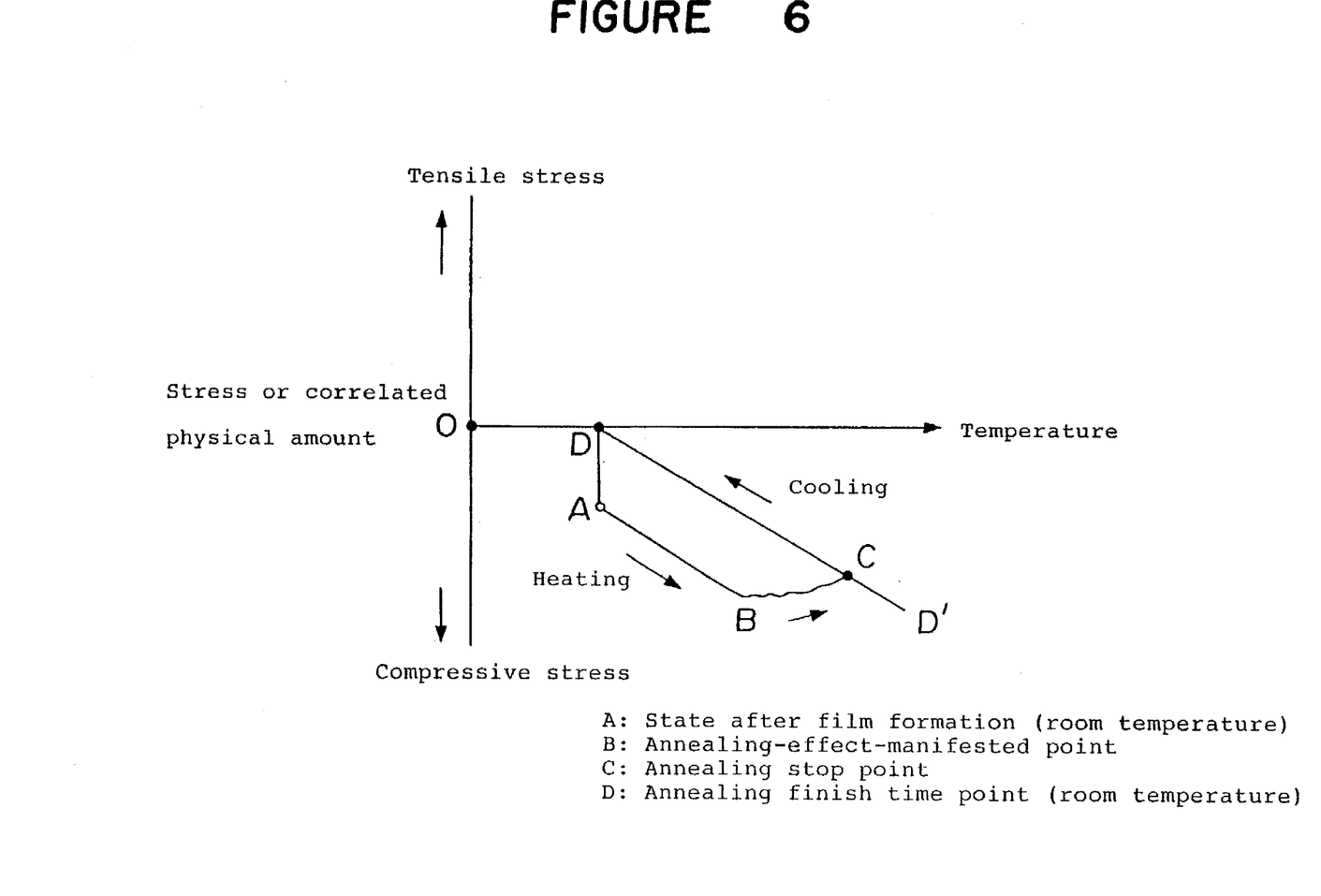
FIG. 6 is a diagram explaining a method of determining an annealing temperature of the X-ray mask according to the third embodiment of the present invention.

Next, an explanation will be given of an annealing step. The annealing step utilizes the principle of stress control of a X-ray absorber disclosed in Japanese Patent Application Hei. No. 5-233187. FIG. 6 is a diagram showing a relationship between annealing temperature and stress illustrating change of stress during annealing. In FIG. 6, the abscissa designates temperature and of ordinate designates stress or a physical quantity correlated with stress (for example, a measured value of a height or a curvature of bow) in which + direction designates a tensile stress and − direction designates a compressive stress. Further, in FIG. 6, A designates a state of stress of an X-ray mask after film formation and before annealing, B designates an annealing-effect-manifested point, C designates an annealing stop point and D designates an annealing finish time point, respectively.

When the X-ray mask shown in FIG. 5(b) is heated, the stress changes as A→B in FIG. 6 due to a difference of the thermal expansion coefficients of silicon that is the material of the substrate and films such as an absorber. When the heating temperature is further elevated, the stress begins to deviate from the straight line A–B. This is because the annealing effect is manifested by a change in crystal structure, evolution of gases included in the absorber, and the like.

Meanwhile, the target is point D. To calculate the point, at a time when the straight line A–B is calculated, a straight line D–D' which is parallel to the straight line A–B and which passes through the annealing finish point D at room temperature where the stress or the physical quantity correlated to the stress is nullified, is previously calculated. Thereby, the stress is monitored even after passing though point B, the annealing is stopped (heating is stopped) at the time of reaching point C intersecting with the straight line D–D' passing through point D and parallel to the straight line A–B and the substrate is cooled to room temperature at which the state of point D is provided. That is, at point D the stress state is the same as that in FIG. 5(a).

Therefore, according to the above-mentioned embodiment, the annealing finish time can be determined by measuring and monitoring the stress or the physical quantity correlated to the stress in annealing with respect to the X-ray mask laminated with all the desired films on each of which pattern the same as that of the X-ray absorber is formed. Therefore, a total of stresses of the patterned layers (the absorber and the etching stopper) can be reduced with excellent reproducibility.

EMBODIMENT 4

Figure 7:
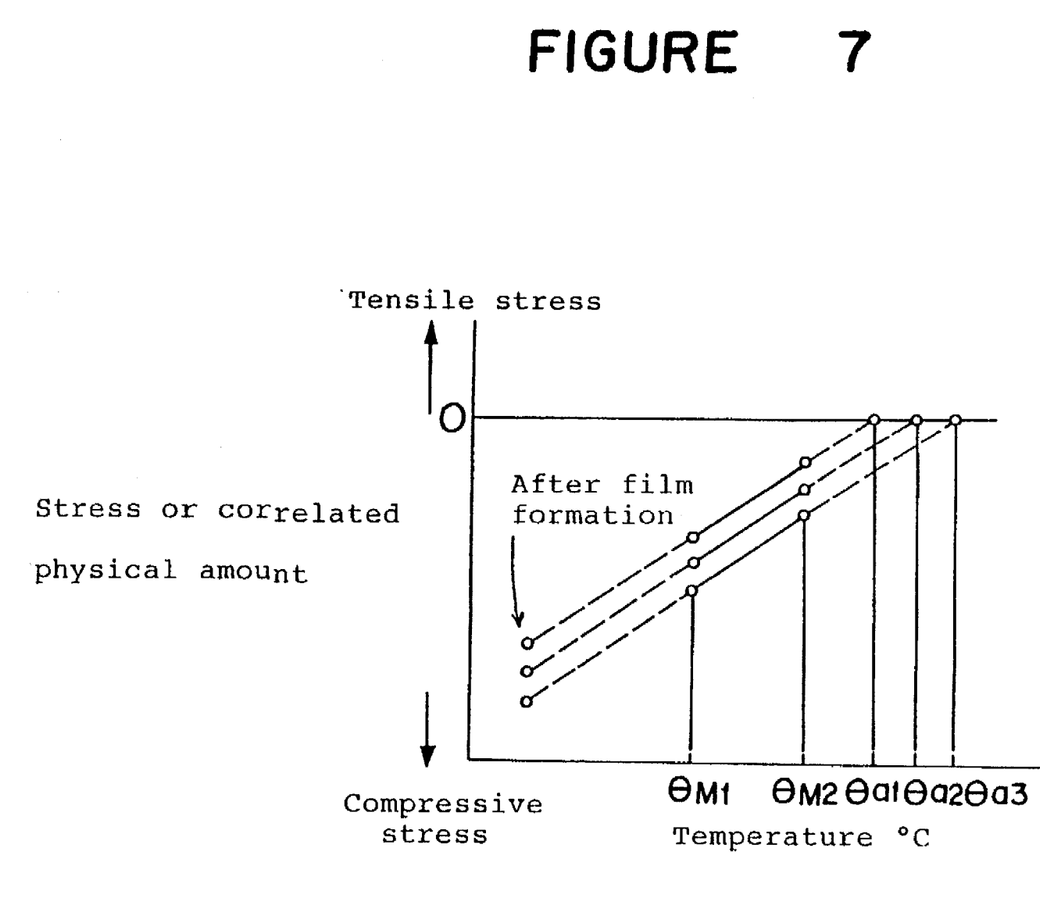
FIG. 7 is a diagram explaining a method of determining an annealing temperature of an X-ray mask according to a fourth embodiment of the present invention.

An explanation will be given of an embodiment of the present invention in reference to the drawings as follows. This embodiment is another embodiment achieving a low stress state by annealing X-ray mask on which a plurality of predetermined layers on each of which a pattern the same as that of an X-ray absorber is formed, are laminated similar to that in the third embodiment. FIG. 7 is a diagram showing a relationship between annealing temperature and stress. In FIG. 7, the abscissa designates an annealing temperature and the ordinate designates a stress or a physical quantity correlated to the stress (for example, a measured value of a height, a curvature etc. of bow) in which + direction designates a tensile stress and − direction designates a compressive stress. In FIG. 7, a relationship between a temperature of annealing and a stress value at that temperature is shown in comparison with that after film formation. With respect to samples 1 through 3, annealing is performed at two temperatures, θM1 and θM2, which are lower than a predicted annealing temperature θ and the stress is measured at every treatment. A final annealing temperature θa is determined for every sample or for every batch by a intersection of a straight line connecting the stress measurement results of the two points and a line nullifying the stress. In this example θa1, θa2 and θa3 are determined with respect to the samples 1, 2 and 3 and the annealing is performed at the determined temperatures by which a laminated film (including the absorber) having low stress is provided.

Although temperatures lower than the annealing temperature θ are chosen to be the two points of θM1 and θM2 in the above-mentioned embodiment, the number of points may be at least two and may be three or more. The more measured points, the more accurate the determined temperature.

EMBODIMENT 5

Figure 8:
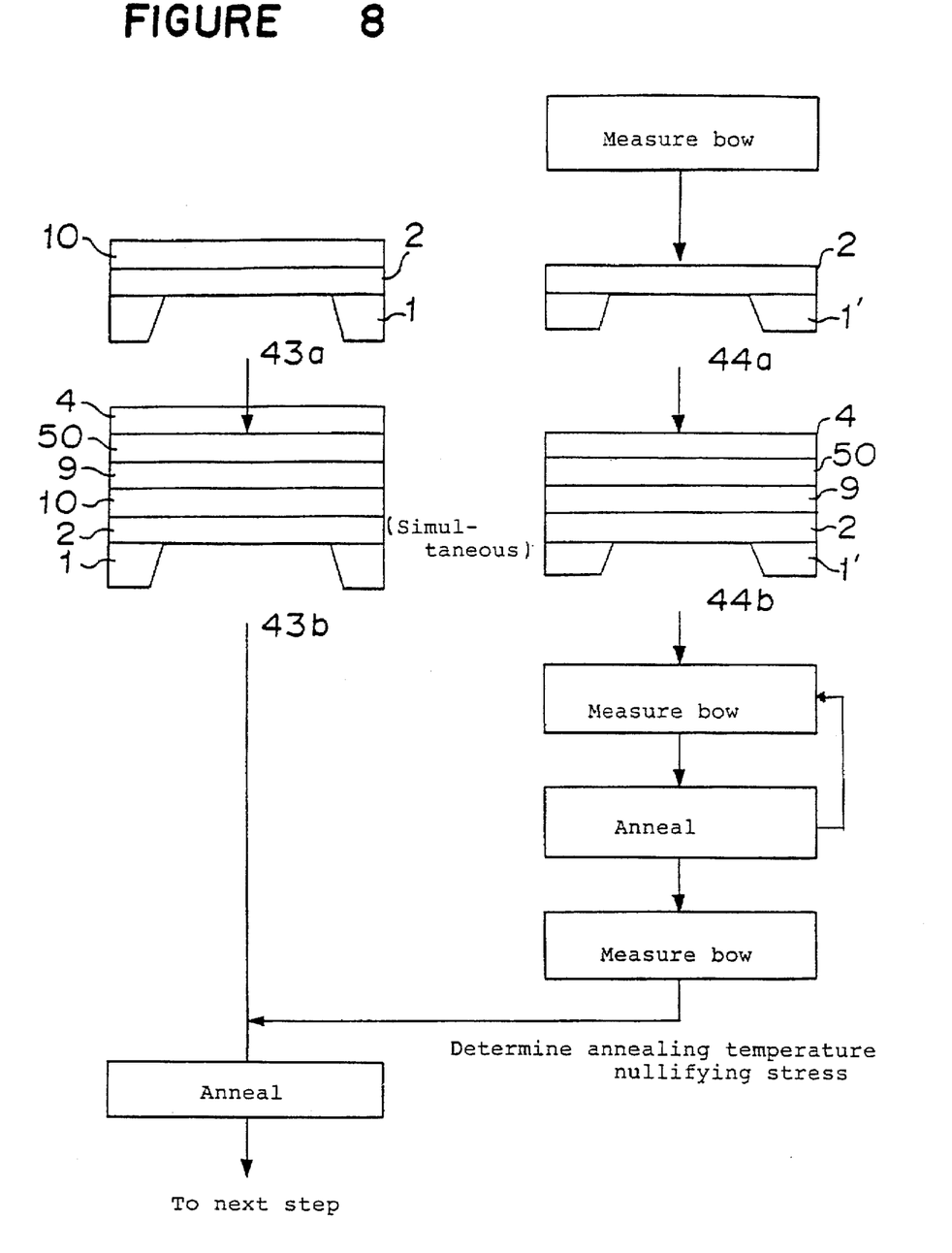
FIG. 8 is a diagram showing a method of manufacturing an X-ray mask according to a fifth embodiment of the present invention.

An explanation will be given of an embodiment of the present invention in reference to the drawings as follows. FIG. 8 is a diagram showing manufacturing steps of steps according to an embodiment of the present invention. In FIG. 8 notation 43a designates a X-ray mask for manufacturing an X-ray mask in which a silicon film is back-etched and a AR coating 10 and a membrane 2 have been formed. Notation 44a designates a back-etched monitor wafer before film formation and notation 44b designates a back-etched monitor wafer after film formation. The film formation of the AR coating 10 is omitted in the monitor wafer 44a before film formation. Next, an etching stopper 9, a planarizing film 50 and an X-ray absorber 4 are formed above the membrane 2 under the same conditions as the manufacturing steps for the X-ray mask 43a by which the monitor wafer 44b is provided simultaneously with the X-ray mask 43a which includes multiple layers. Here, the final annealing temperature is decided by using the monitor wafer 44b and the X-ray mask substrate is annealed at that temperature. Further, the procedure of calculating the final annealing temperature by use of the monitor wafer may use the method of the third or fourth embodiments.

The final annealing temperature is decided by using the monitor wafer after a number of the films have been formed and the X-ray mask substrate is annealed based thereon. However, not only the annealing at the final annealing temperature but processing at the intermediate temperatures of the third or fourth embodiments using the monitor wafer, for example, θM1 and θM2 in the fourth embodiment, may be performed as those for the monitor wafer.

As stated above, according to the first aspect of the present invention, the stress of the X-ray absorber film is evaluated by using the monitor wafer arranged simultaneously with the film formation of the X-ray absorber and accordingly, an accurate stress of the X-ray absorber of the X-ray mask in processing can be known, the low stress state of the X-ray absorber can be achieved by the information and the X-ray mask having high accuracy can be provided.

Further, as stated above according to the second aspect of the present invention, the stresses of the films each having the same pattern with that of the X-ray absorber are considered and controlled summarizingly and accordingly, the positional accuracy of the pattern as the X-ray mask is promoted and the X-ray mask having high accuracy can be provided.

Further, as stated above according to the third aspect of the present invention, the stresses of the films each having the same pattern as that of the X-ray absorber are considered and controlled summarizingly and accordingly, the positional accuracy of the pattern as the X-ray mask is promoted and the X-ray mask having high accuracy can be provided. Further, the final annealing temperature is determined from the relationship between the stress and the annealing temperature by annealing at temperatures lower than the desired temperature and accordingly, the optimum annealing temperature can be set.

Further, as stated above according to the fourth aspect of the present invention, in the second or the third aspect, the monitor substrate is arranged separately for stress measurement and control and accordingly, an accurate stress summarizing that of the X-ray absorber and those of the layers each having the same pattern as that of the X-ray mask in processing can be known and the state of low stress can be achieved by controlling summarizingly the stress by the information. Further, in this way the X-ray mask having high accuracy can be provided.

Further, as stated above according to the fifth aspect of the present invention, in the first or fourth aspect, the substrate in which the back-etching has been performed is used as the monitor substrate and accordingly, the substrate more approximated to that in the actual process is used and an accurate stress more approximated to that of the process can be measured by which the state of the low stress can be achieved. In this way the X-ray mask having high accuracy can be provided.

What is claimed is:

1. A method of making an X-ray mask having reduced stress comprising:

preparing a mask substrate and a monitor substrate made of the same materials and having the same X-ray transmitting membrane structure;

measuring bowing of the monitor substrate;

subsequently, simultaneously depositing substantially identical X-ray absorbing films to form an X-ray mask on the mask substrate and a monitor mask on the monitor substrate whereby the X-ray mask and the monitor mask are similarly bowed;

thereafter, measuring bowing of the monitor mask;

annealing the monitor mask at a first annealing temperature and measuring bowing of the monitor mask after annealing;

from the first annealing temperature and a change in bowing of the monitor mask due to annealing at the first temperature, estimating a second annealing temperature at which bowing of the X-ray mask will be eliminated; and annealing the X-ray mask at the second temperature.

2. The method of claim 1 including exposing part of the X-ray transmitting membrane structure before depositing the X-ray absorbing films.

3. A method of making an X-ray mask having reduced stress comprising:

preparing a mask substrate and a monitor substrate made of the same materials and having the same X-ray transmitting membrane structure;

measuring bowing of the monitor substrate;

subsequently, simultaneously depositing substantially identical X-ray absorbing films to form an X-ray mask on the mask substrate and a monitor mask on the monitor substrate whereby the X-ray mask and the monitor mask are similarly bowed;

thereafter, measuring bowing of the monitor mask;

implanting ions in the monitor mask at a first dosage and measuring bowing of the monitor mask after implanting ions;

from the first dosage and a change in bowing of the monitor mask due to implanting ions at the first dosage, estimating a second ion implantation dosage at which bowing of the X-ray mask will be eliminated; and implanting ions into the X-ray mask at the second dosage.

4. The method of claim 3 including exposing part of the X-ray transmitting membrane structure before depositing the X-ray absorbing films.

5. The method of claim 3 including, after implanting ions in the monitor mask, measuring bowing of the monitor mask to determine the change in bowing of the monitor mask due to implanting ions.

6. A method of making an X-ray mask having reduced stress comprising:

preparing a mask substrate and a monitor substrate made of the same materials;

measuring bowing of the monitor substrate;

subsequently, simultaneously depositing substantially identical X-ray absorbing films having patterns and films having the same pattern as the X-ray absorbing films to form an X-ray mask on the mask substrate and a monitor mask on the monitor substrate whereby the X-ray mask and the monitor mask are similarly bowed;

measuring bowing of the monitor mask;

annealing the monitor mask at a first annealing temperature and measuring bowing of the monitor mask after annealing;

from the first annealing temperature and a change in bowing of the monitor mask due to annealing at the first temperature, estimating a second annealing temperature at which bowing of the X-ray mask will be eliminated; and annealing the X-ray mask at the second temperature.

7. The method of claim 6 including exposing parts of the X-ray absorbing films on the mask substrate and the monitor substrate before depositing the films having the same pattern as the X-ray absorbing films.

* * * * *